United States Patent [19]

Lorentzen

[11] 4,426,685

[45] Jan. 17, 1984

[54] SOLID STATE DELAY DEVICE

[75] Inventor: Robert W. Lorentzen, Milpitas, Calif.

[73] Assignee: The United States of America as represented by the Secretary of the Navy, Washington, D.C.

[21] Appl. No.: 363,336

[22] Filed: Mar. 29, 1982

Related U.S. Application Data

[63] Continuation of Ser. No. 888,118, Mar. 20, 1978, abandoned.

[51] Int. Cl.³ .............................................. G06F 13/02
[52] U.S. Cl. ................................................... 364/900
[58] Field of Search ............................ 364/200, 900; 235/925 H

[56] References Cited

U.S. PATENT DOCUMENTS

| | | | |
|---|---|---|---|
| 3,439,342 | 4/1969 | Barton | 364/900 |
| 3,957,148 | 5/1976 | Milliser | 364/900 |
| 3,999,165 | 12/1976 | Kita et al. | 364/200 |
| 4,052,699 | 10/1977 | Micka | 364/900 |

Primary Examiner—James D. Thomas
Assistant Examiner—David Y. Eng
Attorney, Agent, or Firm—R. F. Beers; Charles D. B. Curry; William C. Daubenspeck

[57] ABSTRACT

A solid state delay device for delaying digital data for short periods of time. Serial digital data is converted into parallel data and input to a number of parallel memory paths. The data is shifted through the memory paths by a clock synchronized with the data. The output of the memory path is reconverted to the original serial digital data delayed by the amount of time required to shift through the memory paths.

1 Claim, 14 Drawing Figures

FIG_1

FIG_4

FIG_3

FIG_5b

FIG_6

FIG_6A

FIG-7

FIG_8A

FIG_8B

FIG_8C

FIG_8D

FIG_9

SOLID STATE DELAY DEVICE

This application is a continuation of application Ser. No. 888,118, filed Mar. 20, 1978, now abandoned.

BACKGROUND OF THE INVENTION

1. Field of the Invention

The present invention relates to data delay devices, and more particularly to a solid state delay device for digital data.

2. Description of the Prior Art

In aerospace applications there are many situations where telemetry data is not immediately available on the ground, either due to the aerospace vehicle not being within range of a ground station or due to the blackout periods associated with missile staging or capsule reentry into the earth's atmosphere. To retrieve this lost telemetry data magnetic recording devices, such as in-flight tape recorders, have been used to record the telemetry data and then replay the recorded data either automatically or upon command from the ground station. Tape recorders have a limited shelf life. Lubricating oil in the bearings runs out due to lack of use. Exercising or use of the recorder to maintain lubrication causes tape wear due to record head/tape friction. The tape wear before flight has to be limited, making the recorder a limited life item.

The aerospace environment is also detrimental to the in-flight tape recorder with its moving parts due to rapid vehicle attitude changes which affect the tape. The tape momentum prevents the tape from changing direction as rapidly as the vehicle attitude changes, resulting in added wear on the moving parts and in damage to the tape. Thus, aerospace tape recorders have a basic application deficiency and redundancy is required in the event one recorder is damaged beyond use in flight.

Thus, it is desirable to develop a storage medium for aerospace vehicle digital data which eliminates moving and limited life parts.

SUMMARY OF THE INVENTION

Accordingly, the present invention provides a solid state delay device for delaying digital data without using moving or limited life parts. The input digital data is converted into parallel data and input into a number of parallel memory bit paths. A clock synchronized with the input digital data steps the data bits along each memory path, each path having a plurality of shift registers connected serially. The output of the memory paths is reconverted to the original digital data delayed by the propagation period along the memory paths. The number of parallel memory paths may be other than an integer multiple of the number of bits for each digital data word or of the number of bits per encoder frame to provide data cycling. Data cycling reduces the effects of a failure in one of the memory paths upon a singular data measurement.

Therefore, it is an object of the present invention to provide a delay device having no moving or limited life parts.

Another object of the present invention is to provide a delay device which uses large scale integrated circuits.

Yet another object of the present invention is to provide a delay device which minimizes the effect of a component failure upon a singular data measurement.

Other objects, advantages and novel features of the present invention will be apparent from the following detailed description when read in conjunction with the appended claims and attached drawing.

DESCRIPTION OF THE PREFERRED EMBODIMENT

Figure 1:
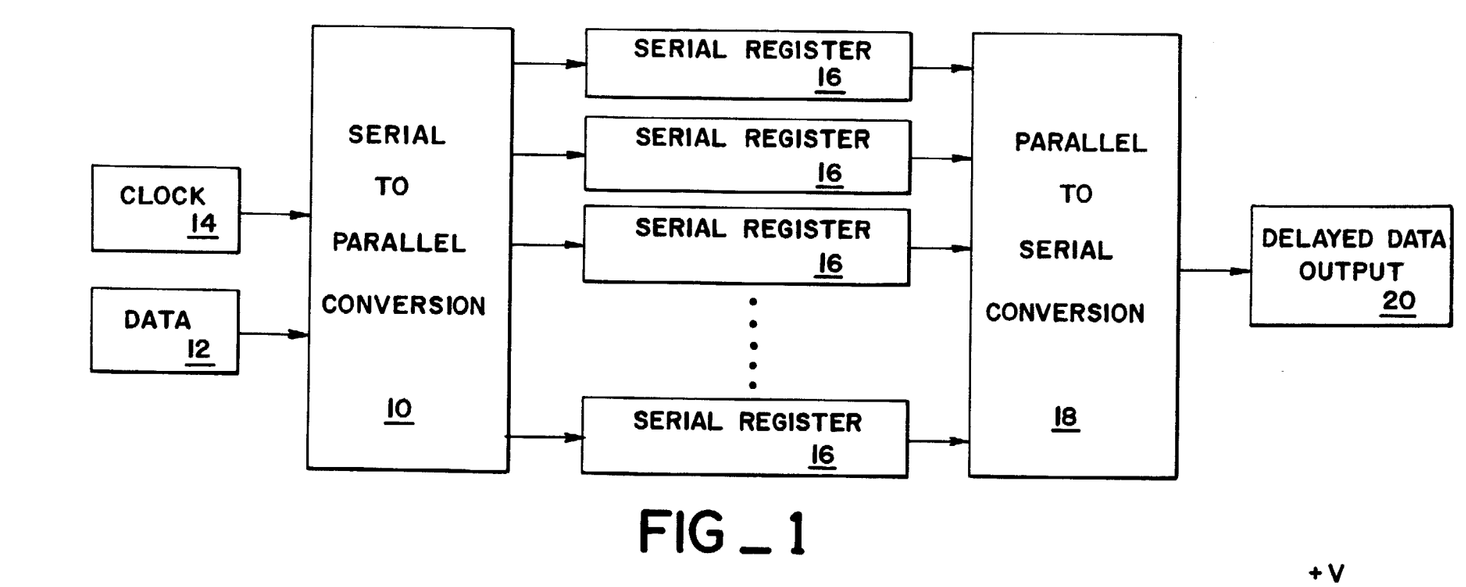
FIG. 1 is a block diagram of a solid state delay device according to the present invention.

Referring now to FIG. 1 a serial-to-parallel converter 10 accepts serial digital data 12, such as PCM NRZL telemetry data or the like, and a system clock 14 which is in synchronization with the digital data. The digital data, usually in the form of x-bit digital words where x may be 8, for example, is converted to parallel data bits. A plurality of serial registers or memory paths 16 are connected in parallel to the output of the serial-to-parallel converter 10 and the data bits are loaded sequentially one into each serial register. The memory paths 16 are loaded cyclically, i.e., the first bit is loaded in the first serial register, the nth bit is loaded in the nth serial register, and the n+1 bit is loaded in the first serial register with the prior bit having been shifted once, n being the number of memory paths. After each cycle the contents of each memory path 16 are shifted once as each new bit is loaded into that memory path. A parallel-to-serial converter 18 reconverts the parallel output of the memory paths 16 into a delayed serial digital data output 20. The delay time is a function of the number of memory paths 16 and the length of each memory path, i.e., the number of clock periods or shifts required for data to propagate the length of the memory path. Each memory path 16 has the same length.

Parallel memory paths are advantageous over a singular serial memory path in that failure of a single component of the memory path does not result in total failure of the delay device. Additionally, by providing a number of memory paths 16 which is not equal to an integer multiple of the number of bits for each digital data word, the digital data words cycle through the memory paths. For example, if the data words are 8-bits long and there are 15 memory paths, the first data word would start with memory path 1, the second with memory path 9, the third with memory path 2, etc. Failure of a single memory path will affect only one bit of the data word. The failure will not affect the data word as a constant error since the same data word in cycling through the memory paths appears on other memory paths in subsequent iterations. Thus, the invalid data bit is readily identifiable. Parallel memory paths also reduce the effective data rate which each serial shift register sees, dramatically reducing current consumption in comparison to single channel data delay device. Such current consumption minimization is an important design consideration for aerospace applications with a limited energy source.

Figure 2:
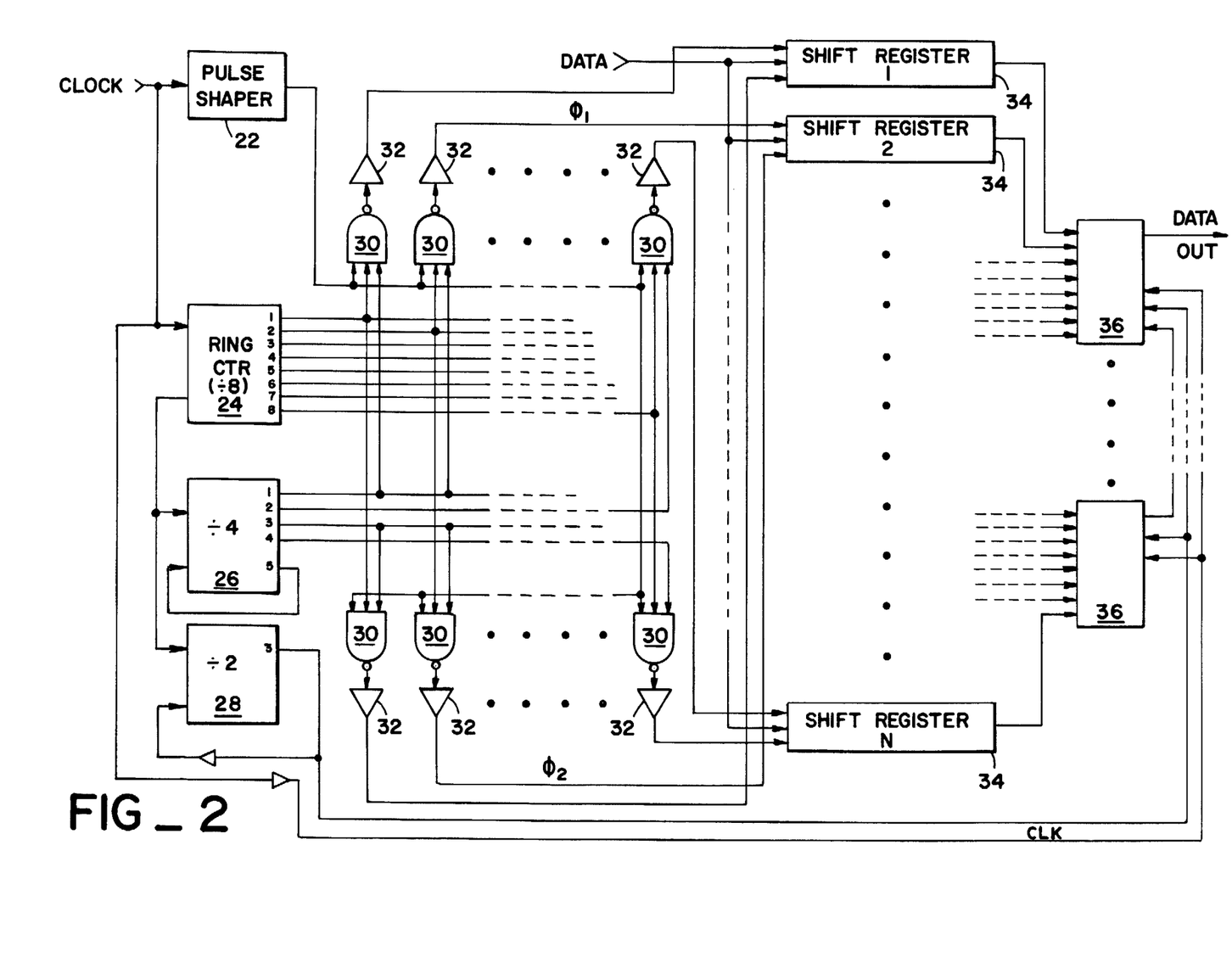
FIG. 2 is a schematic diagram for one embodiment of the solid state delay device according to the present invention.

A particular implementation of the solid state delay device using p-MOS memory technology is shown in FIG. 2. The clock pulses are input to a pulse shaper 22 which provides a pulse on the falling trailing edge of the clock pulse. The clock pulses are also input to a divide-by-eight ring counter 24 which has eight outputs. A divide-by-four counter 26 steps every eighth clock pulse, and a divide-by-two counter 28 provides an output every sixteenth clock pulse. The outputs from the pulse shaper 22, ring counter 24 and divide-by-four counter 26 are input to a plurality of NAND gates 30 so that only one of the NAND gates provides an output for each clock pulse, and a different NAND gate outputs for each clock pulse until all NAND gates have been cycled through. A plurality of line drivers 32, one at the output of each NAND gate 30, amplify and shape the output of each NAND gate. A plurality of parallel serial shift registers 34 are connected to the outputs of line drivers 32. The particular p-MOS serial shift register organization used in this embodiment is 1 × 1024 bits; however, each shift register is internally multiplexed such that each clock pulse ($\phi_1$ and $\phi_2$) loads a data bit. Therefore, one-half of the line drivers 32 are connected to the $\phi_1$ input of the serial shift registers and the other one-half to the $\phi_2$ input of the serial shift registers of each p-MOS register. The data is input to the common input of all the serial shift registers 34 simultaneously, but the data will only be entered into that serial shift register which has a clock pulse applied to it from its line driver 32. As each clock pulse is applied to one of the serial shift registers 34, the data in that register is shifted "right" as the new data bit is entered.

A plurality of combination registers 36 are connected to the shift registers 34, with up to eight shift registers inputting to each combination register and the combination registers connected to each other serially. The combination registers 36 are loaded by a pulse from the divide-by-two counter 28 after each full cycle ($\phi_1$ or $\phi_2$) of clock pulses to the shift registers 34. The data is then clocked out serially from the combination registers 36. The resulting output of the combination registers 36 is the input digital data delayed by the propagation time through the serial shift registers 34.

The number of parallel serial shift registers 34 depends upon the minimum clock rate at which the p-MOS shift registers will operate. The minimum clock rate is determined by the parasitic capacitance discharge rate of the MOS/FET's, i.e., the length of time for which the data bit can be stored within each stage of the serial shift register 34. The number of shift registers per serial shift register 34 is a function of the amount of delay time desired.

Figures 3, 4:
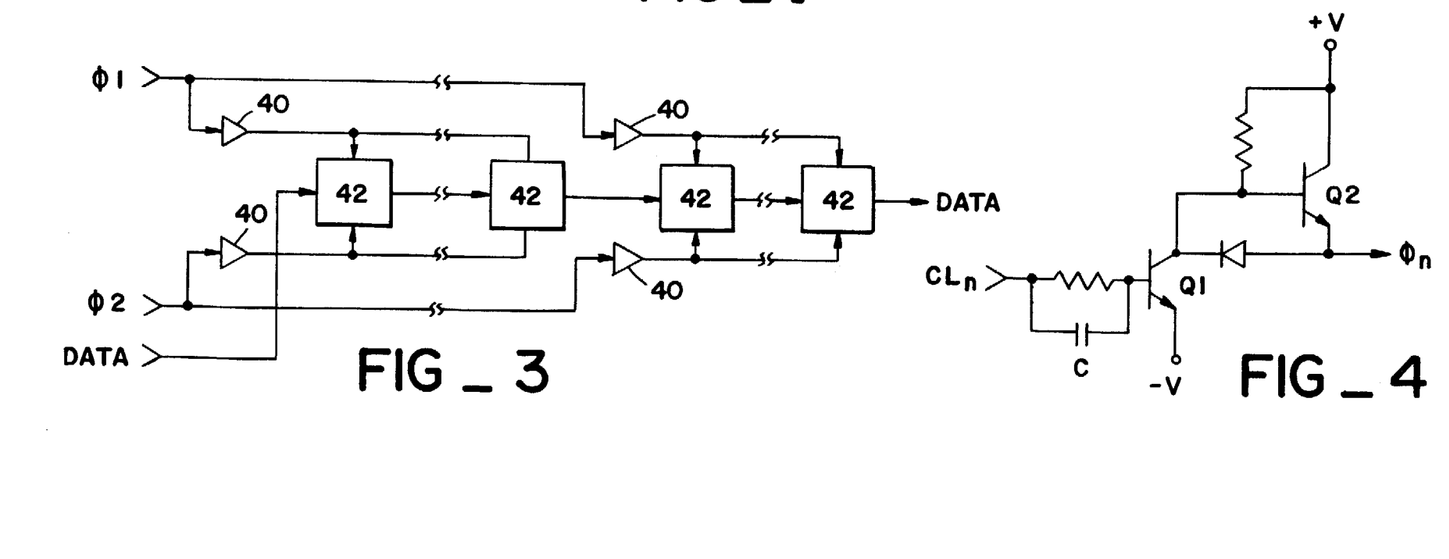
FIG. 3 is a schematic diagram of one memory path for the solid state delay device of FIG. 2.
FIG. 4 is a schematic diagram of one line driver for the solid state delay device of FIG. 2.
Figure 5A:
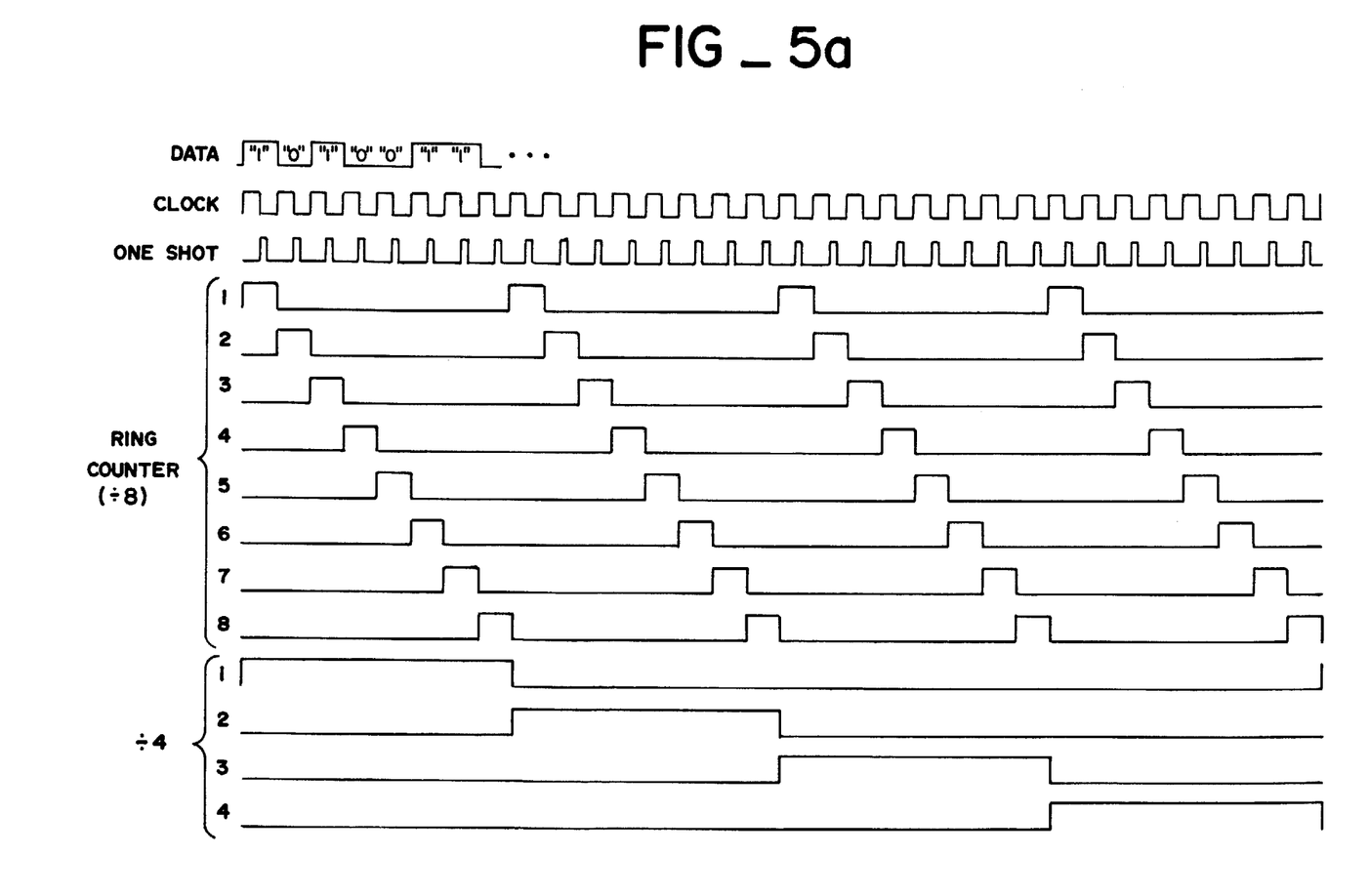
FIG. 5A, 5B is a timing diagram for the solid state delay device of FIG. 2.
Figure 5B:
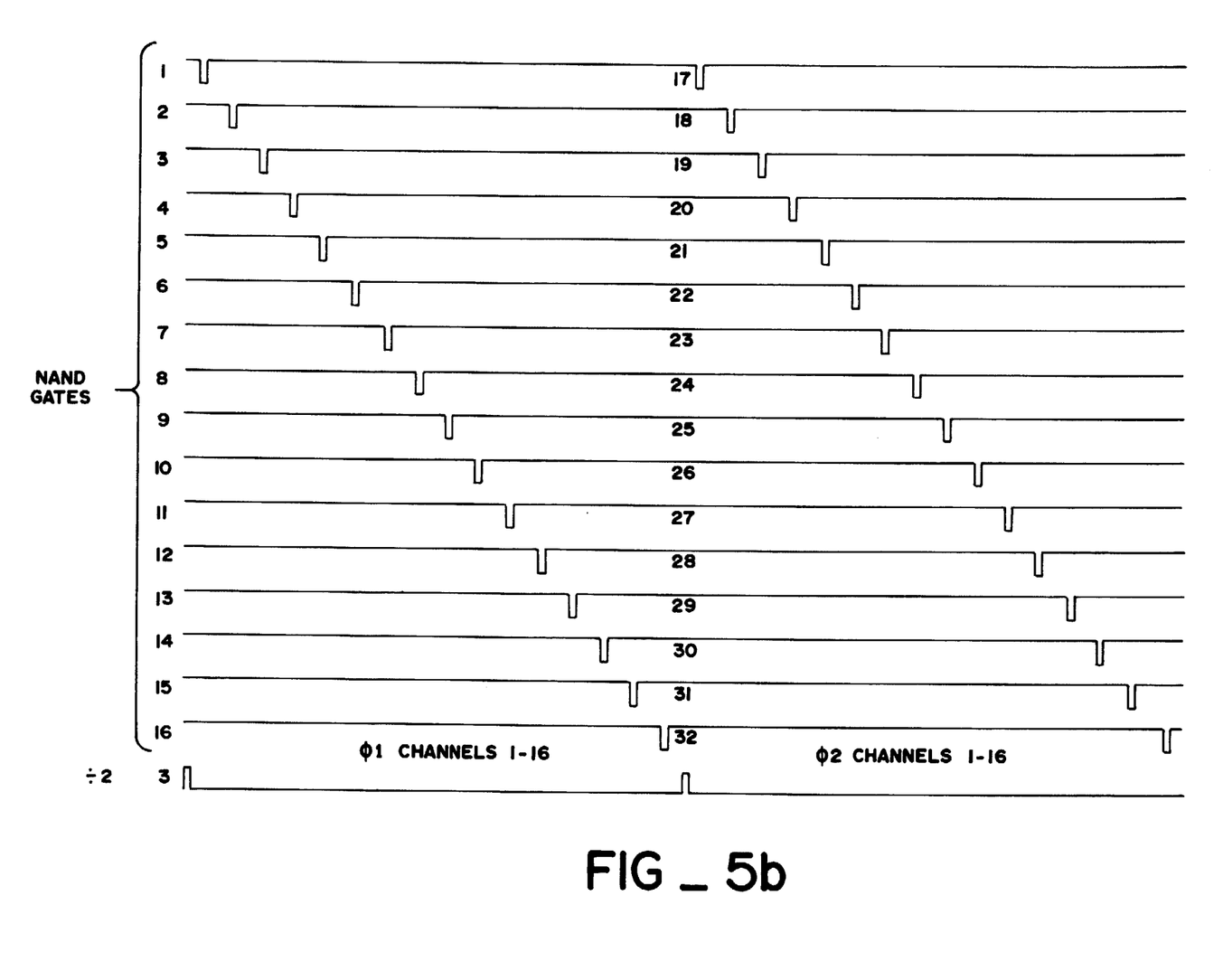

FIG. 3 shows a typical p-MOS serial shift register 34 using the 1 × 1024 bit organization. $\phi_1$ represents a clock pulse from one of the first one-half of the line drivers 32 and $\phi_2$ represents a corresponding clock pulse from one of the second one-half of the line drivers 32. Amplifiers 40 amplify the clock pulses, $\phi_1$ and $\phi_2$. A plurality of p-MOS chips 42 are connected to the amplifiers 40 so that each $\phi_1$ or $\phi_2$ pulse to a shift register will shift data one bit. The number of $\phi_1$ and $\phi_2$ clock pulses is dictated by the number of parallel memory paths. For a 16 memory path device 16 $\phi_1$ and $\phi_2$ pulses are required as shown in FIG. 5. The digital data bit to be input is applied to the first p-MOS chip 42 and is entered into the channel corresponding to the data clock pulse applied, $\phi_1$ or $\phi_2$. The p-MOS chips 42 are connected serially so that the data bits are shifted serially through each chip in turn until output to the combination registers 36. The data bit is stored as a charge on the parasitic capacitance of each p-MOS/FET stage within the chip 42.

A typical line driver 32 is shown in FIG. 4. The clock pulse from one of the NAND gates 30, $CL_n$, is input to a common-emitter configured transistor, $Q_1$, having a speed-up input capacitor C, to provide amplification. A second transistor, $Q_2$, is connected in series with the output of transistor $Q_1$ to provide low impedance and high current drive to the following serial shift register 34 in the form of a clock pulse, $\phi_n$.

FIG. 5 is a timing diagram for the schematic of FIG. 2. The input digital data in the form of PCM NRZ-L data is input to the plurality of serial shift registers 34, 16 in the present example. The clock is synchronized with the PCM data at one cycle per bit. The pulse shaper 22 provides a narrow output pulse at the falling trailing edge of each clock pulse. The leading edge of each clock pulse causes the ring counter 24 to increment by one, recycling each eight clock pulses. The carry from the ring counter 24 is applied to the inputs of the divide-by-four and divide-by-two counters, 26 and 28 respectively. The outputs of the ring counter 24, the divide-by-four counter 26 and the pulse shaper 22 are combined by the NAND gates 30 to provide the 32 gate pulses for the 16 serial shift registers 34.

The output of the divide-by-two counter 28 results in a pulse, since the output also resets the counter. This pulse loads the combination registers after 16 bits have been entered into the 16 serial shift registers 34 (one bit each serial path). The clock pulse serially shifts the 16 bits from the combination registers 36, reproducing the PCM NRZ-L data at the output.

Figure 6:
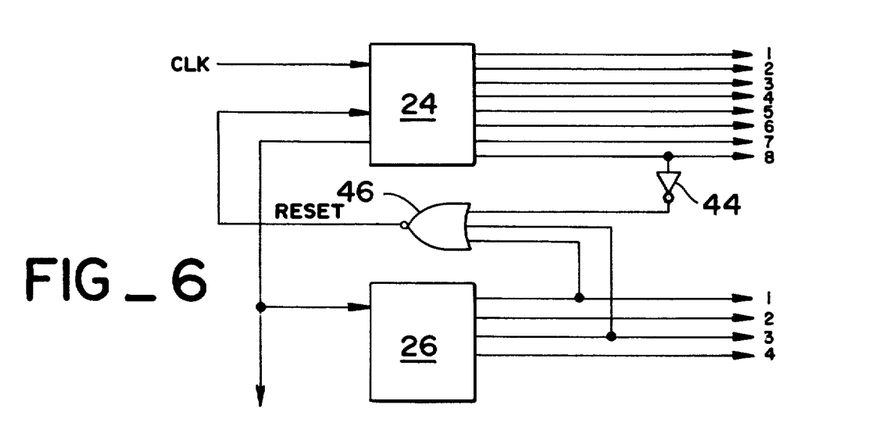
FIG. 6 is a schematic diagram of a variation of the solid state delay device of FIG. 2.
Figure 6A:
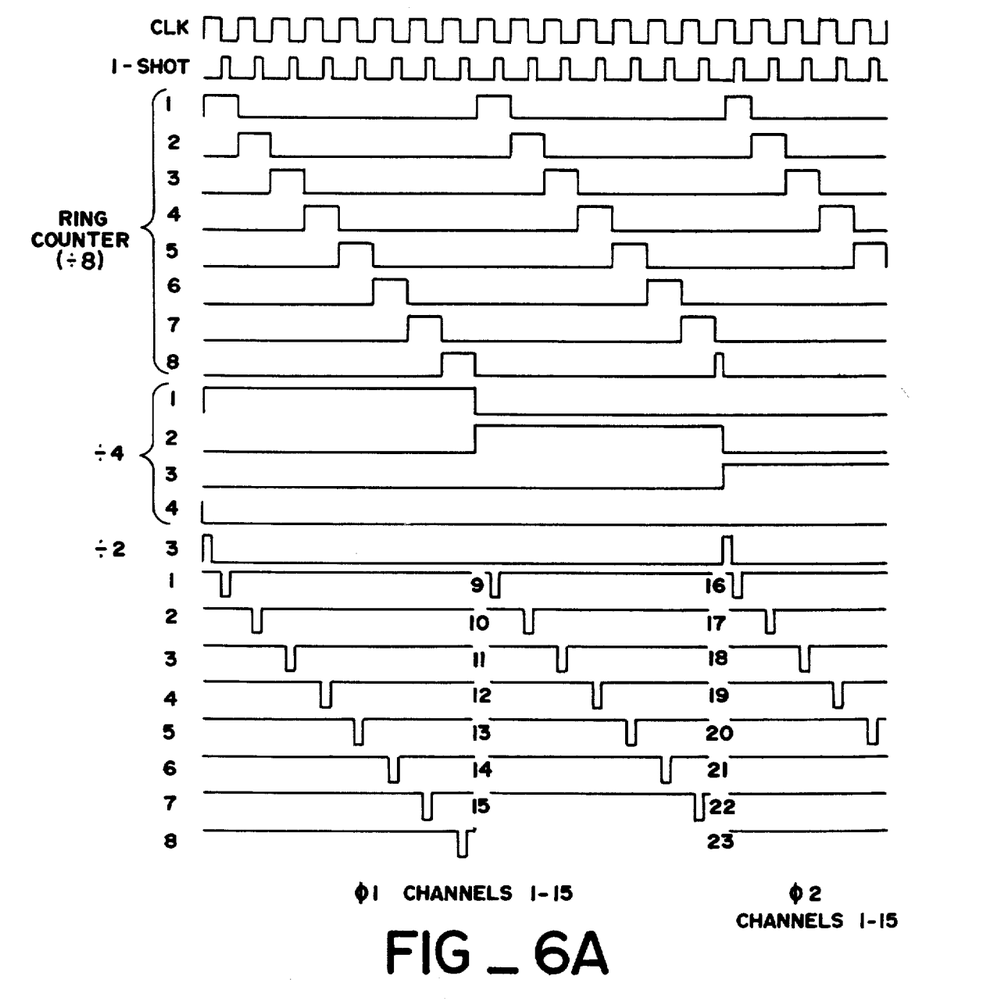
FIG. 6A is a timing diagram for the variation of FIG. 6.

To provide data word cycle through the serial shift registers 34 the ring counter 24 is reset after 7 counts on alternate cycles as shown in FIG. 6 together with the timing diagram of FIG. 6A. The output of the 8-line from the ring counter 24 is inverted by inverter 44 and combined with the 1- and 3-line outputs of the divide-by-four counter 26 by NOR gate 46. For the first eight clock pulses the 1-line of the divide-by-four counter is positive while the 3-line is negative and the output of NOR gate 46 is negative, i.e., the ring counter 24 cycles through the 8 positions normally. For clock pulses 9–15 the 1- and 3-line outputs of the divide-by-four counter 26 are negative and the inverted 8-line from the ring counter 24 is positive, producing a negative output from NOR gate 46. On the 16th clock pulse the inverted 8-line goes negative producing a positive output from NOR gate 46, the leading edge of which recycles the ring counter 24 to the 1-line output and increments the divide-by-four counter 26. Thus, for 8-bit data words only 30 NAND gates 30 and 15 serial shift registers 34 would be used, resulting in the data words cycling through the serial shift registers as described previously.

Figure 7:
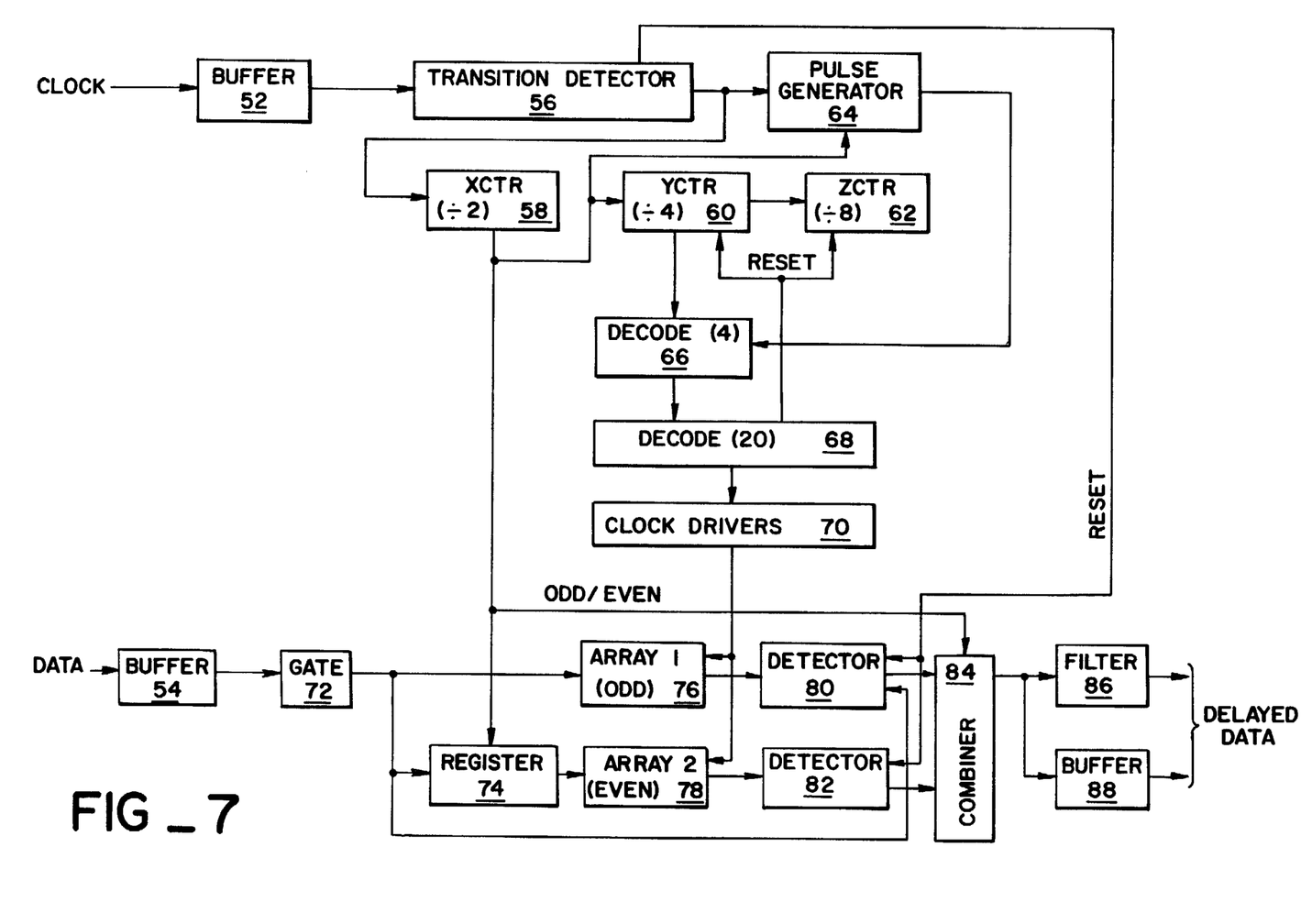
FIG. 7 is a block diagram of another embodiment of the solid state delay device according to this invention.

Another embodiment of the solid state delay device is shown in FIG. 7. The clock and data inputs are fed to buffers, 52 and 54 respectively, to provide circuit isolation and impedance matching. A transition detector 56 detects the leading and trailing edges of the clock pulses from the clock buffer 52. An X-counter 58 divides by two the clock pulses from the transition detector 56 to provide an ODD/EVEN output, a Y-counter 60 divides by four the output of the X-counter, and a Z-counter 62 divides by eight the output of the Y-counter to provide up to 32 data pulses to convert the serial data into up to 32 parallel data bits. A pulse generator 64 accepts the trailing edge detected clock pulses and the ODD/EVEN output from the X-counter 58 and forms a strobe pulse for every second clock pulse. A first decoder 66 combines the Y-output with the strobe pulse to provide four Y-pulses. A second decoder 68 combines the Y-pulses with the Z-output to provide up to 32 data pulses. For the embodiment shown in FIG. 6 only 20 data pulses are desired, so the 21st data pulse resets the Y-counter 60 and the Z-counter 62 to one, i.e., the second decoder 68 provides an output as if it were a 20 position ring counter. Clock drivers 70 are used to drive the data clock pulses for the data memory paths.

A gate 72 accepts the data from the data buffer 54 and in conjunction with a register 74 divides the data into ODD and EVEN bits. The register 74 holds the EVEN bit for one clock pulse. Two memory arrays, 76 and 78 for the ODD and EVEN bits respectively, provide 20 memory paths each having n positions, n being a function of the desired delay time as is the number of memory paths selected, 20 in this embodiment. The data clock pulses step each memory path of each array, 76 and 78, sequentially so that the ODD bit and the held EVEN bit are loaded simultaneously into their respective arrays. An ODD detector 80 and an EVEN detector 82 are connected to the outputs of the ODD array 76 and the EVEN array 78, respectively. A combiner 84 recombines the ODD and EVEN bits from the detectors, 80 and 82, into serial bits, gating being provided by the ODD/EVEN output of the X-counter 58. The output of the combiner 84 is the input data delayed by the propagation time through the arrays, 76 and 78. The delayed data may be filtered by a low pass filter circuit 86, or may be unfiltered. An output buffer 88 provides the amplification and impedance matching for the unfiltered delayed data.

Figure 8A:
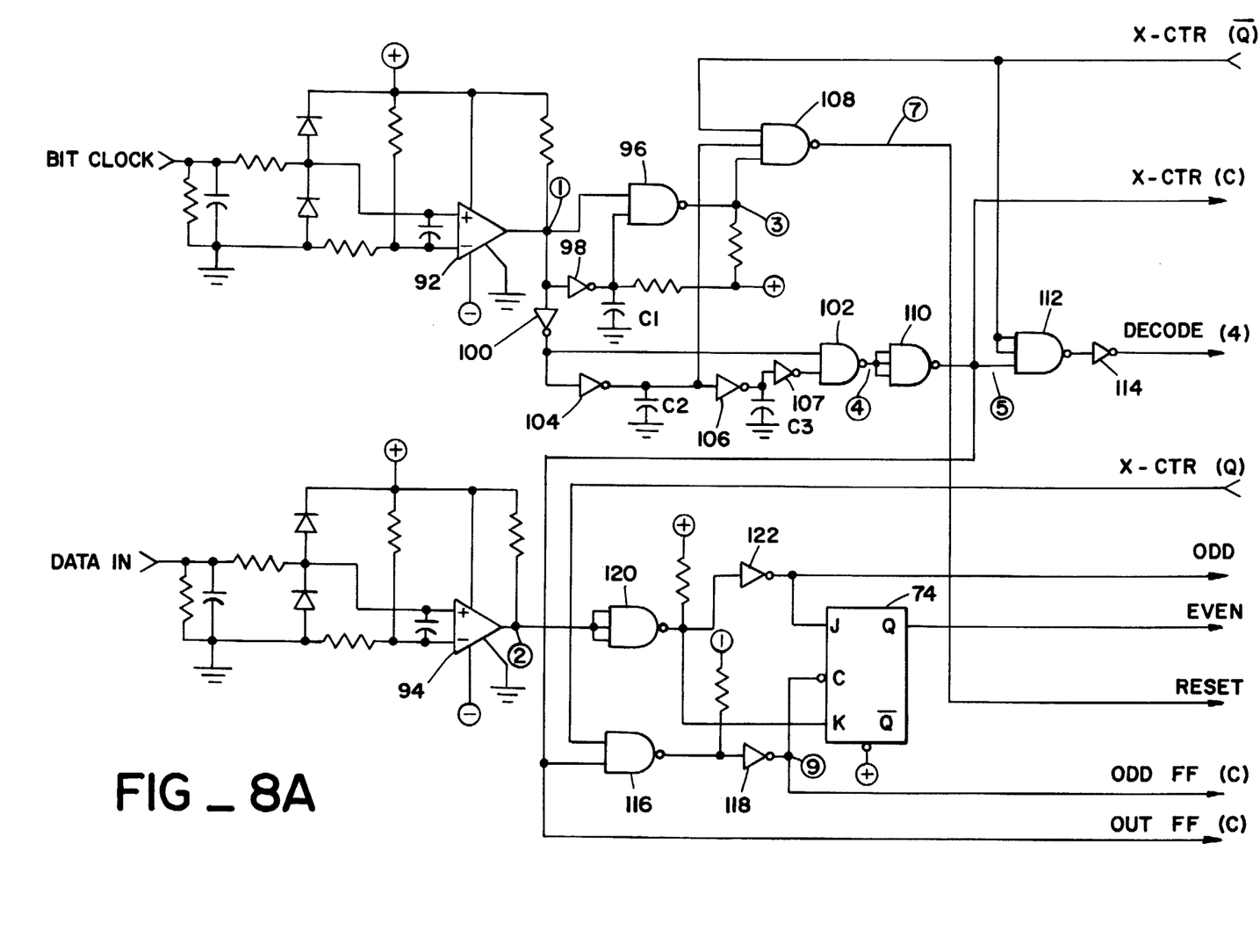
FIG. 8A, 8B, 8C, 8D is a schematic diagram of the solid state delay device of FIG. 7.
Figure 8B:
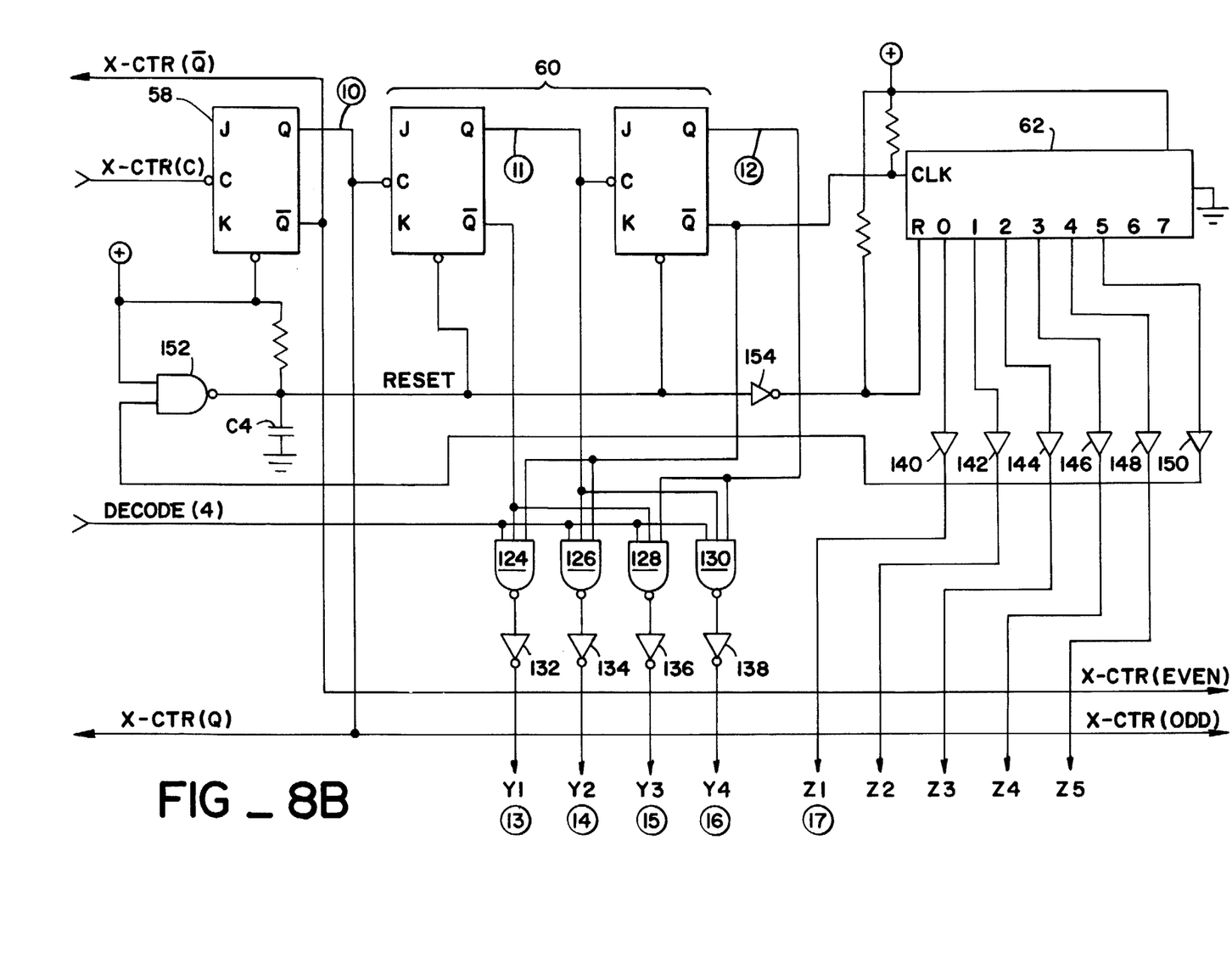
Figure 8C:
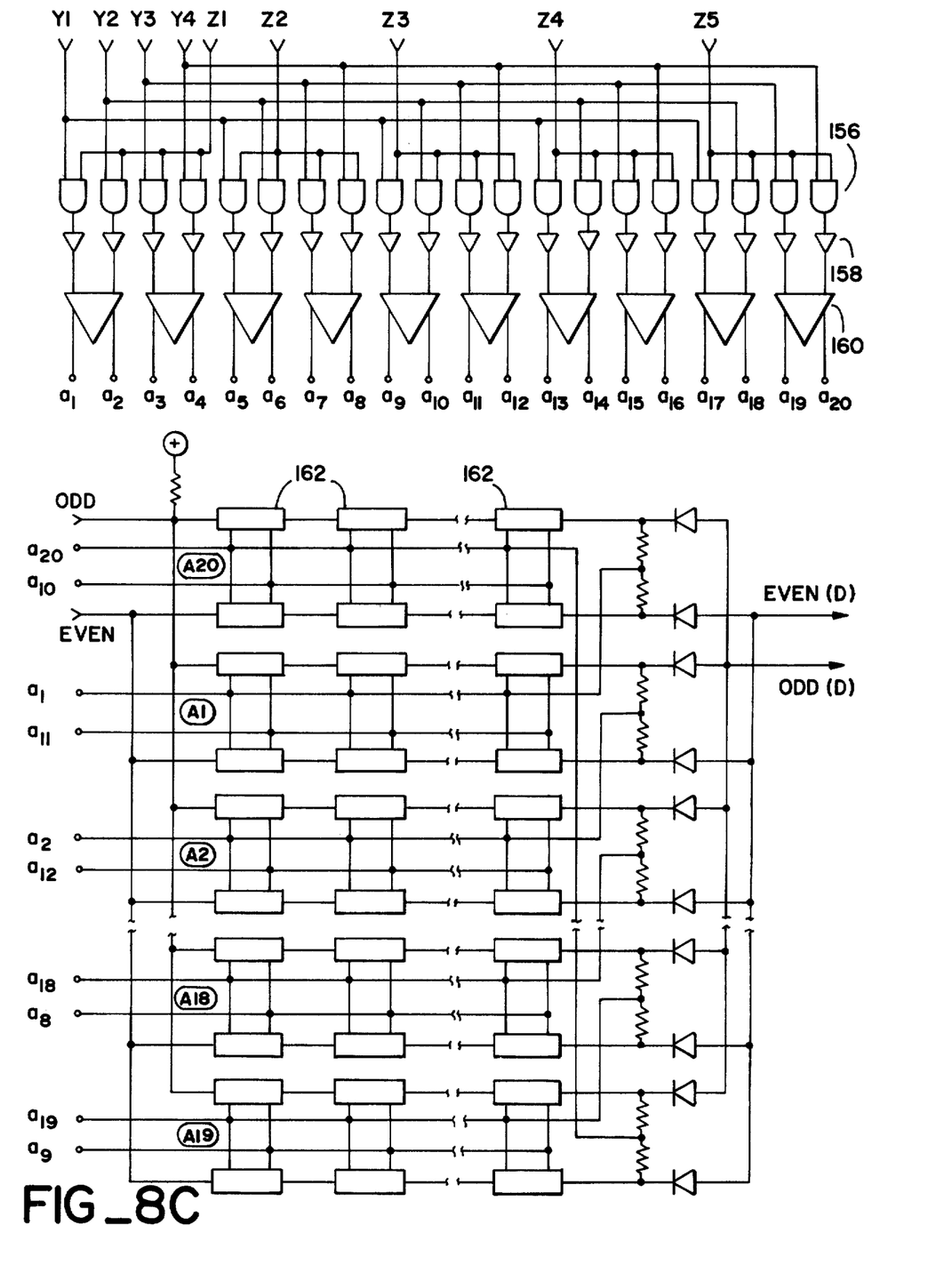
Figure 8D:
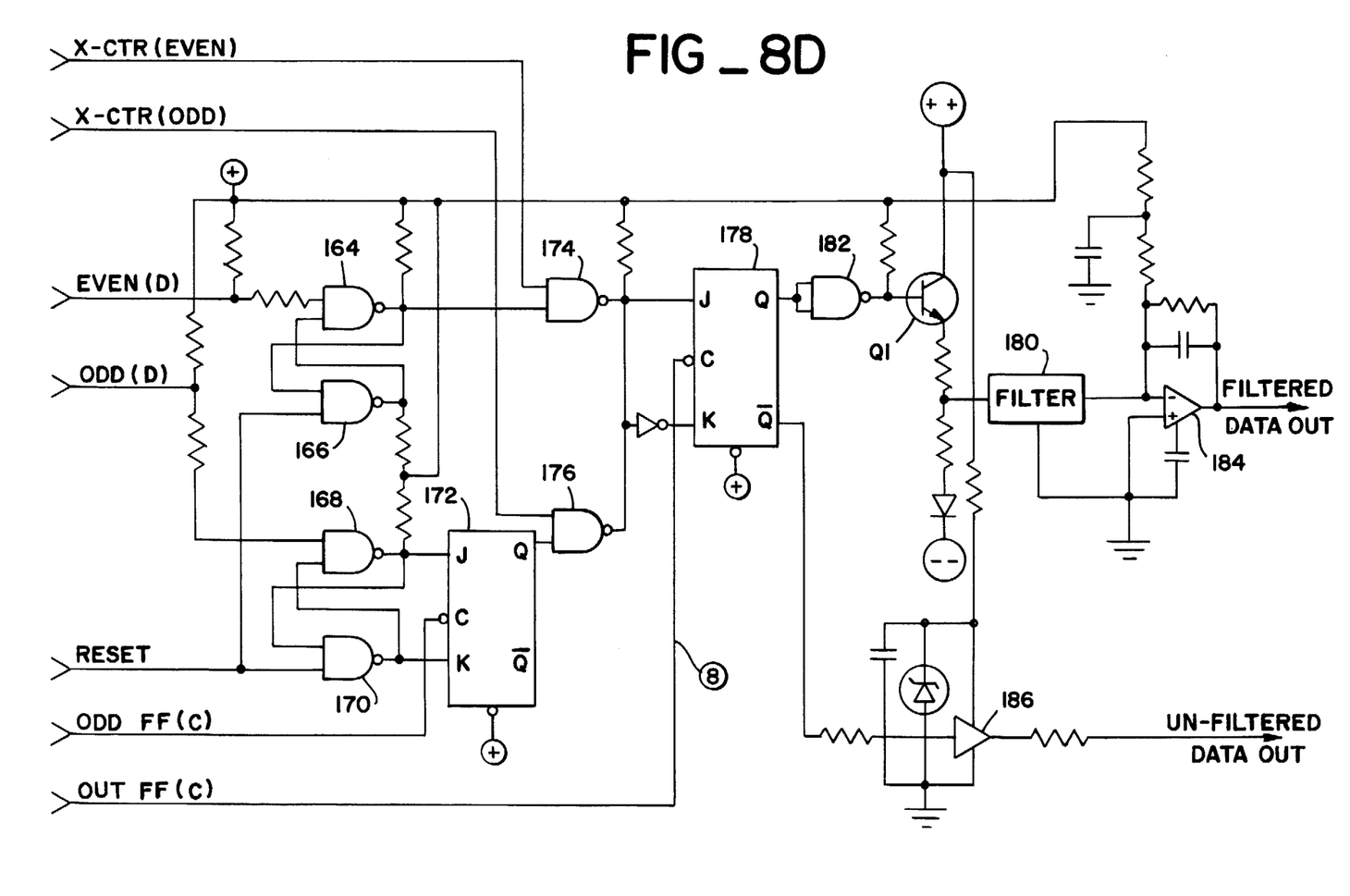

FIG. 8A, B, C, D illustrate in greater detail the solid state delay device of FIG. 7. The input buffering and level detection for the bit clock and the input data is provided by respective comparators 92 and 94. The bit clock from comparator 92 is input to NAND gate 96 and two inverters 98 and 100. The output of inverter 98 is connected to the second input of NAND gate 96. A capacitor C1 also is connected between the output of the inverter 98 and circuit ground so that when the leading edge of the bit clock occurs the output of inverter 98 discharges the capacitor, the discharge time determining the pulsewidth of the negative going pulse from NAND gate 96. The output of inverter 100 is applied to NAND gate 102 and inverter 104. The output of inverter 104 is applied to inverter 106 and NAND gate 108, the leading edge pulse from NAND gate 96 also being applied to NAND gate 108. The charge time of capacitor C2 delays the leading edge response of inverter 104 a time corresponding to the pulsewidth of the leading edge pulse from NAND gate 96 so that NAND gate 108 is disabled during the first half of the positive bit clock cycle. On the trailing edge of the bit clock capacitor C2 is discharged by inverter 104 and the output of inverter 106 is delayed by the charge time of capacitor C3 and inverted by inverter 107 which determines the pulse width of the negative going trailing edge pulse from NAND gate 102. NAND gate 110 inverts the falling trailing edge pulses from NAND gate 102 to provide positive data clock pulses. An ODD/EVEN signal from the X-counter 58 gates on NAND gate 108 to provide a reset to the detectors 80 and 82 during the ODD data time, and gates on NAND gate 112 during the ODD data time to provide a strobe clock pulse from inverter 114 to the first decoder 66.

The data clock pulses from NAND gate 110 are applied to NAND gate 116 together with the ODD/EVEN signal time. Inverter 118 inverts the EVEN time data clock pulses from NAND gate 116 so that the falling trailing edge of the EVEN time data clock pulse enables register 74 to store an EVEN data bit. The data bits from comparator 94 are applied via NAND gate 120 and inverter 122 to the inputs of register 74 where the EVEN bits are stored. Since the strobe clock pulse which occurs during the ODD bit time stores both the ODD and EVEN data bits simultaneously in arrays 76 and 78, as will be described subsequently, the ODD bits are stored from inverter 122 and the EVEN bits from register 74.

The data clock pulses are also input to the X-counter 58 which changes state for each data clock pulse to provide the ODD/EVEN signal. The ODD signal is input to the Y-counter 60 which has two flip-flops in series to provide four Y outputs. The falling trailing edge of the ODD signal triggers the first Y-counter flip-flop to change state, and the falling trailing edge of the output from the first flip-flop triggers the second Y-counter flip-flop. The Y-counter 60 thus provides two normal outputs and two inverted outputs which are combined with the strobe clock pulse in NAND gates 124, 126, 128 and 130 to provide four Y output pulses. Inverters 132, 134, 136 and 138, one for the output of each of the NAND gates 124, 126, 128 and 130, provide the positive Y1, Y2, Y3 and Y4 clock pulses. The inverted output of the second Y-counter flip-flop provides the input for the Z-counter 62, an eight position ring counter. The rising leading edge input to the Z-counter 62 causes the counter to step. Each output of the Z-counter 62 is amplified by amplifiers 140, 142, 144, 146, 148 and 150, only six being required since for this example only 20 individual pulse signals are required, to provide the Z1 through Z6 signals. Z6 is applied to NAND gate 152 to provide an output reset pulse to reset the Y-counter 60 and via inverter 154 the Z-counter 62. Capacitor C4 governs the width of the reset pulse.

The Y and Z pulses are combined by a plurality of NAND gates 156, the output of the NAND gates being inverted by inverters 158, to provide essentially a 20-position ring counter for the example given. A plurality of two-phase MOS clock drivers 160 have an input to each phase occurring at the same time. The outputs of the clock drivers 160 control the ODD and EVEN arrays, 76 and 78. Each array 76, 78 has a plurality of memory paths, each path being a series of shift registers 162. For a 20×12K array there are 20 parallel paths for the ODD array 76 and 20 for the EVEN array 78, and each path has a series of 12 1024-bit shift registers. Each clock pulse shifts all the bits of a single corresponding memory path in both the ODD and EVEN arrays 76 and 78, i.e., ODD and EVEN data is input simultaneously bit by bit into the arrays. Each clock pulse also enables the preceding sequential memory path to be read out, ODD and EVEN data in corresponding paths being output simultaneously. For example, clock pulse a₁ shifts the ODD and EVEN shift registers 162 for memory paths A1 and enables the readout for memory paths A20.

The delayed ODD and EVEN data bits from the arrays 76 and 78 are input to two respective latches, each having two NAND gates. As result of each detector reset each latch is forced to a negative output. The delayed EVEN data bit is input to NAND gate 164, the output of which is input to NAND gate 166 which provides the second input to NAND gate 164. The detector reset pulse from NAND gate 108 which occurs before the EVEN data arrives at NAND gate 164 provides the second input to NAND gate 166. This reset places NAND gates 164 and 166 in fixed states. In like manner the delayed ODD data bit is input to NAND gate 168 which together with NAND gate 170 forms the ODD detector 80. When the delayed EVEN data bit arrives at gate 164 and is positive, the output of NAND gate 164 is negative which holds the output of NAND gate 166 positive. A delayed EVEN data bit that is negative changes the output of NAND gate 164 positive which forces a negative output from NAND gate 166. The ODD output from NAND gate 168 is delayed one data clock pulse by ODD flip-flop 172 to compensate for the input delay by one data clock pulse of the EVEN data in register 74. The delayed EVEN and ODD data bits are input to NAND gates 174 and 176, respectively, together with the appropriate ODD-/EVEN signal which enables the respective NAND gates alternately. An output flip-flop 178 samples each NAND gate 174 and 176 each data clock pulse and outputs the data bit corresponding to the enabled gate, thus restoring the original serial digital data bit stream. The output of the output flip-flop 178 is inverted and filtered by a passive low pass filter 180 and inverted, amplified and impedance matched by operational amplifier 184, or left unfiltered and inverted and amplified by amplifier 186 to buffer the output.

Data cycling in this example is provided by careful choice of the number of data paths in the two memory arrays with respect to the bits per encoder frame. For example, for an encoder frame of 128 8-bit words (1024 bits/frame), the first data word will pass through memory paths 1–4 ODD and EVEN arrays (in the first frame.) In the second, third fourth and fifth frames the first data word would pass through paths 13–16, 5–8, 17–20 and 9–12 ODD and EVEN arrays, respectively. Then the first data word repeats its paths through the memory arrays at paths 1–4 ODD and EVEN arrays.

Figure 9:
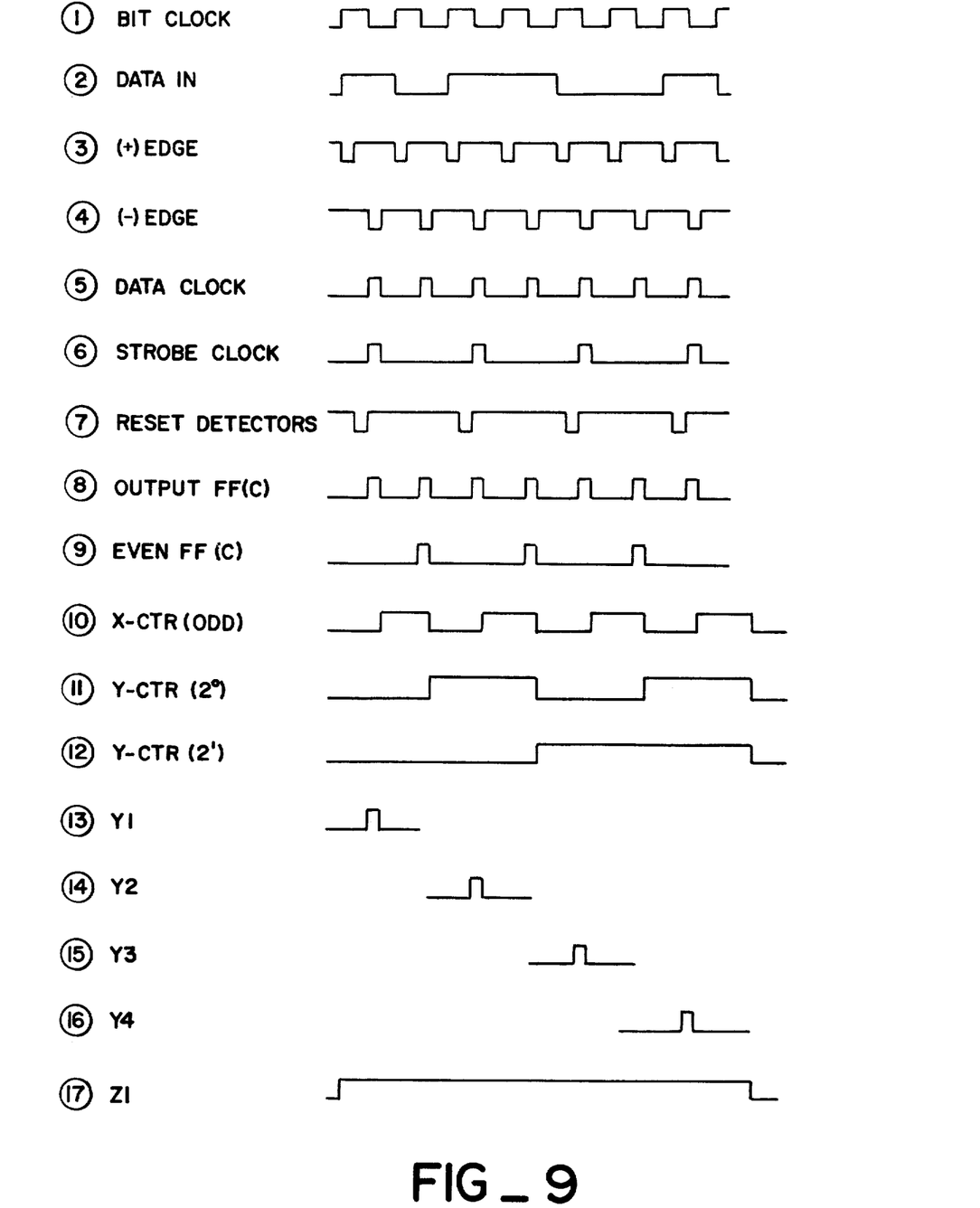
FIG. 9 is a timing diagram for the solid state delay device of FIG. 7.

The numerals within circles on FIG. 8 refer to the corresponding lines of the timing diagram of FIG. 9. As is apparent the trailing edge of the bit clock produces the data clock pulses and the strobe clock pulses for every second data clock pulse. The strobe clock pulse combined with the Y-counter outputs produce the Y pulses which subsequently are combined with the Z pulses to produce the 20 individual sequential clock pulses for entering and stepping data bits through the ODD and EVEN arrays 76 and 78. For a bit rate of approximately 524 KHz the data is delayed approximately 1.0 second. Increasing the size of the arrays results in longer delays.

Other serial storage means besides serial shift registers may be used, such as magnetostrictive, acoustic or optical delay lines.

Thus, the present solid state delay device provides a data delay means for short delay periods up to 3 seconds without having moving or limited life components which are subject to damage in an aerospace vehicle environment.

What is claimed is:

1. A solid state delay device for delaying a continuous stream of serial digital data in the form of 8-bit words of PCM NRZL data for a fixed period of time which comprises:
  (a) fifteen shift registers identified by $S_1$, $S$, ...$S_{15}$, each said shift register having the same length;
  (b) means for coupling said digital data to the input of each said shift register;
  (c) clock means for providing a series of clock pulses in synchronism with said digital data;
  (d) means for distributing said clock pulses to said shift registers to load said first data bit received in shift register $S_1$, the second data bit in shift register $S_2$..., the 15th data bit in shift register $S_{15}$, the sixteenth bit received being loaded in shift register $S_1$, thereby shifting said first bit to the second position in said shift register $S_1$, and so on for succeeding bits; wherein said means for distributing said clock pulses to said shift registers includes:
    (1) a first counter having a data input, a reset input, eight decoded outputs, and a carry output, the clock pulses being coupled to said data input of said first counter;
    (2) a second counter having a data input, a reset input, and five decoded outputs, the carry output of said first counter being coupled to the data input of said second counter and the fifth decoded output of said second counter being coupled to the rest input of said second counter;
    (3) a third counter having a data input, a reset input, and three decoded outputs, the data input of said third counter being coupled to the carry output of said first counter, the third decoded output of said third counter being coupled to the rest input of said third counter;
    (4) a three-input NOR gate, the first and third decoded outputs of said second counter and the inverted eighth decoded output of said first counter being coupled via said NOR gate to the rest input of said first counter; and
    (5) thirty NAND gates coupled to the decoded outputs of said first and second counters and the clock pulses for providing thirty individual gating pulses, said gating pulses being coupled sequentially to said shift register $S_1, S_2,...S_{15}, S_1, S_2,...S_{15}$, and so on for succeeding bits,
  (e) means for combining the data bits at the output of said shift register to reproduce said continuous stream of serial digital data, whereby said digital data received by said delay device is delayed by a fixed period of time which is a function of the length of said shift registers and of the bit rate of said digital data; and wherein said means for combing the data bits at the output of said shift registers includes:
    (a) parallel-input, serial-output shift register means having its input coupled to the data output of said shift registers $S_1$–$S_{15}$, the output of the shift registers $S_1$, $S_2$...$S_{15}$ being coupled to the first input, second input,...15th input, respectively, of said parallel-input, serial-output shift register means, the load input of said parallel-input, serial-output shift register means being coupled to the third decoded output of the third counter for loading the outputs of said shift register $S_1$-$S_{15}$ into the parallel-input, serial-output shift register means, the lock input of said parallel-input, serial-output shift register means being coupled to said clock pulses for serially shifting said register synchronously with the bit rate of said digital data.

* * * * *